(12) United States Patent
Lin et al.

(10) Patent No.: US 6,424,183 B1
(45) Date of Patent: Jul. 23, 2002

(54) CURRENT COMPARATOR

(75) Inventors: Hong-Chin Lin, Taipei; Jie-Hau Huang, Taichung Hsien; Shyh-Chyi Wong, Taichung, all of (TW)

(73) Assignee: Windbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/892,006

(22) Filed: Jun. 26, 2001

(30) Foreign Application Priority Data

Dec. 11, 2000 (CN) .......................................... 89126365 A

(51) Int. Cl.[7] ................................................. H03K 5/22
(52) U.S. Cl. .............................. 327/85; 327/78; 327/87
(58) Field of Search ............................. 327/77, 78, 85, 327/87

(56) References Cited

U.S. PATENT DOCUMENTS 6,275,075 B1 * 8/2001 Min ............................. 327/77
6,320,427 B1 * 11/2001 Shi et al. ...................... 327/80

OTHER PUBLICATIONS

H. Traff, Novel Approach to High Speed CMOS Current Comparators, Electronics Letters, Jan. 30, 1992, vol. 28 No. 3.
A.T.K. Tang & C. Toumazou, High Performance CMOS Current Comparator, Electronics Letters, Jan. 6, 1994, vol. 30 No. 1.
L. Ravezzi, D. Stoppa & G.–F. Dalla Betta, Simple High–Speed CMOS Current Comparator, Electronics Letters Oct. 23, 1997, vol. 33 No. 22.
Byung–Moo Min and Soo–Won Kim, High Performance CMOS Current Comparator Using Resistive Feedback Network, Electronics Letters, Oct. 29, 1998, vol. 34 No. 22.

* cited by examiner

Primary Examiner—Terry D. Cunningham

(57) ABSTRACT

The present invention discloses a current comparator having simple, cheap and fast characteristics, especially discloses a current comparator having a small dead zone and excellent driving capability. The current comparator of the present invention comprises a first CMOS transistor, a second CMOS transistor, a diode-configured N-type transistor, a fourth CMOS transistor and a fifth CMOS transistor.

6 Claims, 7 Drawing Sheets

CURRENT COMPARATOR

BACKGROUND OF THE INVENTION

1. Field of the Invention

The present invention relates to a current comparator, and particularly to a current comparator with high speed and low current.

2. Description of Related Art

As the products with low voltage and low power consumption are entensively used, current comparators with low currents have always been concerned in the recent ten years. Besides, there is a trend to entensively utilize a current mode switching circuit instead of a voltage mode switching circuit. Therefore, the current comparator has become an important component. For example, a prior art in Journal of IEEE. Solid. State. Vol. 30, pp. 1239–1245, entitled "A 200 MHz Pipelined Multiplier Using 1.5V-Supply Multiple-Valued MOS Current-Mode Circuits," disclosed an arithmetic operation of a current mode switching circuit. Besides, a current sense amplifier has been used to read data in a lot of SRAM, DRAM and Flash memory. For example, a reference is disclosed in Journal of IEEE. Solid. State. vol. 26, pp. 525–536, entitled "Current-Mode Techniques for High-Speed VLSI Circuits with Application to Current Sense Amplifier for CMOS SRAM." Furtherrnore, the current mode switching circuit has also been used in an AID converter. For example, a prior art is disclosed in Electron Lett. Vol. 27, pp. 818–820, entitled "Current-Mode Cyclic ADC for Low Power and High Speed Applications." In addition, some applications such as temperature sensor and image sensor, which are needed to generate a low current, also utilize a current comparator. A known problem called "dead zone" happens if the input current is so small that all transistors cannot be activated. Therefore, how to shrink the dead zone region of a current comparator is an important topic for engineers.

FIG. 1 is a prior art current comparator with positive feedback and low input impedance. When the current Iin flows into the circuit in FIG. 1 from the point V1, the output voltage Vout shows a high level voltage. On the contrary, when the current flows out of the circuit of FIG. 1, the output voltage Vout shows a low level voltage. If the amplitude of the input current is large enough, such as 10 $\mu$A, the operational speed of the circuit is fast. But if the amplitude of the input current is so little, the operational speed will be greatly slowed down due to the existence of a dead zone.

To overcome the above problems, a fixed current method and a bias method that connects a pair of NMOS and PMOS transistors serving as diodes have been proposed. In the former method, a good and accurate current source is necessary. In the latter method, the substrate of the pair of NMOS and PMOS transistors needs to connect to source terminals, and that is difficult to implement in a CMOS technology. Besides, the latter method needs the two transistors having large channel widths to charge/discharge output terminals and thereby avoid a body effect if its source terminals do not connect to the substrate. In addition, the output terminal of the above prior art methods has to connect several inverters to output a rail-to-rail voltage since their driving capabilities are weak.

Another prior art method utilizes feedback resistors as shown in FIG. 2 to detect a low current. The disadvantage of the prior art is that its gain is not so large that a lot of inverters need to be cascaded to generate a rail-to-rail result.

In conclusion, known current comparators, especially when the current being under 1 $\mu$A, have a complicated structure and a slow operational speed and consume too much power.

SUMMARY OF THE INVENTION

The primary object of the present invention is to offer a low current comparator having simple, cheap and fast characteristics, especially to provide a low current comparator having a small dead zone and an excellent driving capability.

For achieving the above objects, the present invention provides a current comparator with high speed and low current, which comprises a first CMOS transistor, a second CMOS transistor, a diode-configured N-type transistor, a third CMOS transistor, a fourth CMOS transistor and a fifth CMOS transistor. The first CMOS transistor includes a first P-type transistor and a first N-type transistor. Source terminals of the first P-type transistor and N-type transistor are connected to an input signal of the current comparator. The second CMOS transistor includes a second P-type transistor and a second N-type transistor. Gate terminals of the second P-type transistor and N-type transistor are connected to the input signal. The diode-configured N-type transistor has a gate-drain terminal and a source terminal, which are respectively connected to drain terminals of the second CMOS transistor. The gate-drain terminal of the diode-configured N-type transistor is further connected to the gate terminal of the first N-type transistor, and the source terminal of the diode-configured N-type transistor is further connected to the gate terminal of the first P-type transistor. The gate terminal of the N-type transistor of the third CMOS transistor is connected to the gate-drain terminal of the diode-configured N-type transistor, and the gate terminal of the P-type transistor of the third CMOS transistor is connected to the source terminal of the diode-configured N-type transistor. The gate terminals of the fourth CMOS transistor are connected to the output of the third CMOS transistor. The gate terminals of the fifth CMOS transistor are connected to the output of the fourth CMOS transistor, and the output of the fifth CMOS transistor is the output of the current comparator.

With the above structure, the diode-configured N-type transistor can also be replaced by a diode-configured P-type transistor, and just modifying a few connections. Since the gain of the first CMOS transistor increases and the input impedance of the first CMOS transistor decreases, the current comparator is sensitive to a low current and generates a fast response. In addition, since a diode-configured NMOS transistor pulling up the voltage of gate terminals of the input stage and output stage is used, the driving capability of the input stage and output stage of the present invention is enhanced and thereby the dead zone region is shrunk. Furthermore, since the gate-drain terminal and source terminal of the diode-configured NMOS are respectively connected to gate terminals of the third CMOS transistor, the driving capability of the fourth CMOS transistor will be enhanced and thereby avoid cascading a series of inverters shown in prior arts.

In another embodiment, MOS transistors whose gate terminals are applied with a modulated voltage and have the same carrier type with the transistors of the fourth CMOS transistor are connected to the drain terminals of the fourth CMOS transistor. Therefore, the present invention can adjust the switching voltage of the CMOS inverters according to different process corners.

BRIEF DESCRIPTION OF THE DRAWINGS

The present invention will be described according to the appended drawings in which.

PREFERRED EMBODIMENT OF THE PRESENT INVENTION

Figure 3:
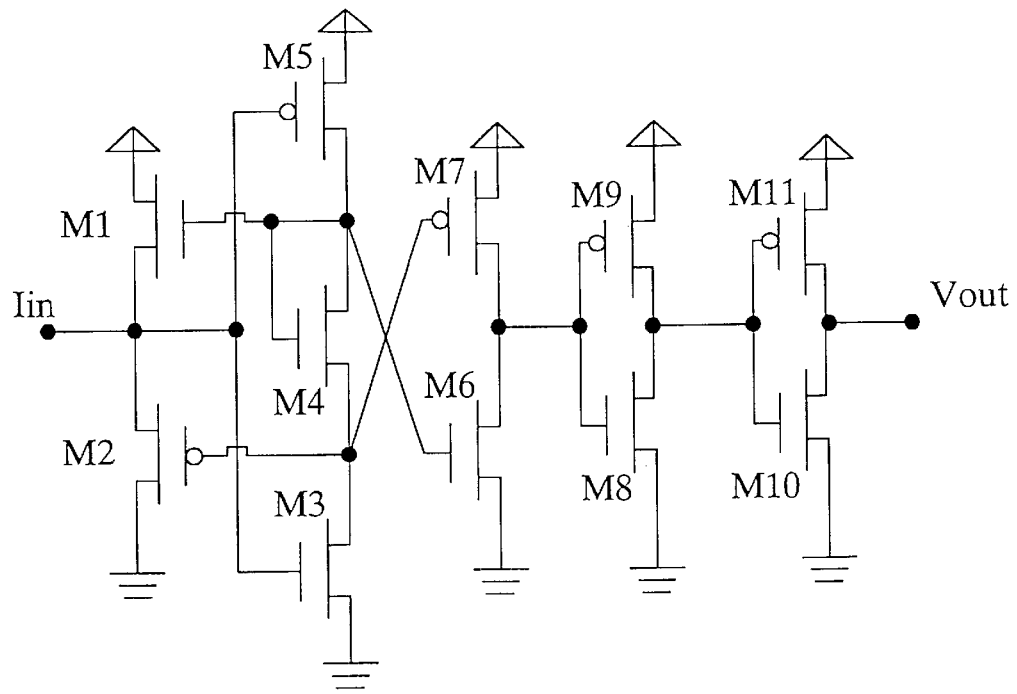
FIG. 3 shows a circuit diagram of one embodiment of a current comparator according to the present invention.

FIG. 3 shows a circuit diagram of one embodiment of the current comparator according to the present invention. The current comparator has five CMOS transistors and a diode-configured CMOS transistor M4. The first CMOS transistor includes a first N-type transistor M1 and a first P-type transistor M2, and the second CMOS transistor includes a second N-type transistor M3 and a second P-type transistor M5. The source terminals of the transistors M1 and M2 and the gate terminals of the transistors M3 and M5 are connected to an input signal Iin. The configuration of M1 and M2 are formed as an input stage of the current comparator to reduce input impedance.

The second CMOS transistor including M3 and M5 forms a reference current generating stage. The MOS transistor M4 adopts a diode-configured form and has a gate-drain terminal and source terminal. The MOS transistor M4 no matter being a P-type or N-type could be placed between source terminals of the second CMOS transistor. If the MOS transistor M4 is N-type, the gate-drain terminal is connected to the gate terminal of the first N-type transistor M1, and the source terminal is connected to the gate terminal of the first P-type transistor M2. If the MOS transistor M4 is P-type, the gate-drain terminal is connected to the gate terminal of the first P-type transistor M2, and the source terminal is connected to the gate terminal of the first N-type transistor M1.

The third CMOS transistor includes transistors M6 and M7. The gate terminal of the transistor M6 is connected to the drain terminal of the diode-configured transistor M4 and the gate terminal of the transistor M7 is connected to the source terminal of the diode-configured transistor M4. Since the diode-configured transistor M4 pulls up the voltage of gate terminals of the third CMOS transistor, the voltage difference between gate and source terminals is enlarged and the driving capability of the third CMOS transistor is also enhanced. Both the fourth CMOS transistor including transistors M8 and M9 and the fifth CMOS transistor including transistors M10 and M11 serve as inverters for amplifying output signals and keeping a rail-to-rail output. If necessary, the fourth and fifth CMOS transistors can be duplicated to enhance the driving capability of the current comparator of the present invention. Since the driving capability of the third CMOS transistor is better than that of prior arts, the number of inverters used in the current comparator could be reduced.

If using inverters to serve as an amplifier, the circuit is sensitive to different process corners. On the other words, since the transistors would be manufactured in different process corners, the outputs of the transistors M6 and M7 may be out of the threshold voltages of the inverter including M8 and M9.

Figure 4:
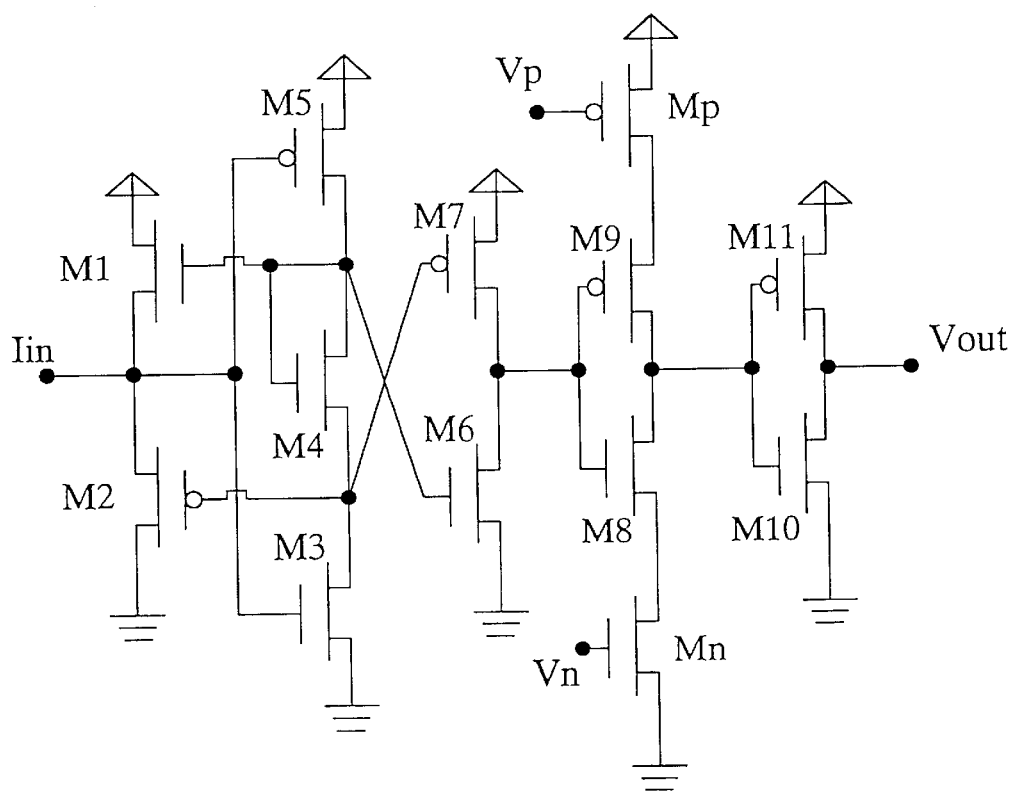
FIG. 4 shows a circuit diagram of a second embodiment of a current comparator according to the present invention.

FIG. 4 shows a circuit diagram of a second embodiment of the current comparator according to the present invention, which appends a PMOS transistor Mp and an NMOS transistor Mn in the structure shown in FIG. 3. The source terminals of Mp and Mn are connected to the source terminals of the fourth CMOS transistor including transistors M9 and M8, the drain terminals of Mp and Mn are connected to power and ground respectively, and the gate terminals of Mp and Mn are applied with a modulated voltage Vp and Vn respectively. Therefore, the transistors Mn and Mp could be utilized to adjust the threshold voltage of the inverter including M8 and M9. In a typical case, Vn is equal to a power voltage Vdd, and Vp is equal to a ground voltage.

The advantages of utilizing the transistor M4 in FIG. 3 and FIG. 4 are not only to economize the number of the transistors, but also to reduce the channel width. The voltage difference (Vgs-Vth) of the transistor M4 is proportional to a mean square value of the current flowing through the transistors M3, M4 and M5, wherein Vgs represents the voltage difference between gate and source terminals, and Vth represents a threshold voltage. Since the input current Iin is very small, the current variation and voltage difference (Vgs-Vth) of the transistor M4 is small. In addition, the input impedance of the present invention is about $1/(g_{m1}+g_{m2})$, wherein $g_{m1}$ and $g_{m2}$ represent transconductance gains of the transistors M1 and M2 respectively. Therefore, since the existence of the transistor M4 pulls up the gate voltage of the transistor M1, Vgs of the transistor M1 is larger than that of prior arts and thereby the input impedance of the present invention is much smaller than that of the prior art shown in FIG. 1.

Furthermore, the purpose of connecting the drain terminal and source terminal of the transistor M4 to the gate terminals of the transistors M6 and M7 is to supply a current charging/discharging function for the gate terminals of the transistors M8 and M9 and thereby increases the operational speed Besides, since it is not necessary to flow a large current through the transistors M6 and M7, the channel lengths of the transistors M6 and M7 should be increased to save power consumption. The channel lengths of the transistors M1 and M2 could be designed with the minimal linewidth of the process, and the widths of the transistors M1 and M2 could be designed by arranging the source voltage of the transistor M1 being a half of the power voltage $V_{dd}$. The design methodology of the transistors M8, M9, M10 and M11 could be done like that of the transistors M1 and M2. It is necessary to pick up suitable channel lengths of transistors, satisfy the high-speed requirement and slow down the power consumption concurrently. Table 1 lists suitable channel lengths and widths of the related transistors according to a typical process corner and linewidth being 0.35 $\mu$m.

TABLE 1

| Index of transistors | width ($\mu$m) | length ($\mu$m) | Carrier type of transistors |
| --- | --- | --- | --- |
| M1 | 0.5 | 0.35 | N |
| M2 | 1.2 | 0.35 | P |
| M3 | 0.5 | 0.6 | N |
| M4 | 0.5 | 0.7 | N |
| M5 | 2.5 | 1 | P |
| M6 | 0.6 | 1 | N |
| M7 | 1.8 | 1 | P |
| M8 | 0.8 | 0.35 | N |
| M9 | 3.7 | 0.35 | P |

TABLE 1-continued

| Index of transistors | width ($\mu$m) | length ($\mu$m) | Carrier type of transistors |
|---|---|---|---|
| M10 | 0.9 | 0.35 | N |
| M11 | 3.5 | 0.35 | P |
| Mn | 1.9 | 0.35 | N |
| Mp | 5 | 0.35 | P |

As follows, for improving the performance of the present invention, several experimental results are listed and based on the conditions: Vdd being equal to 3V, the linewidth being equal to 0.35 $\mu$m, a reference current in FIG. 2 being 50 $\mu$A, and the channel length and channel width selected from Table 1.

Figure 1:
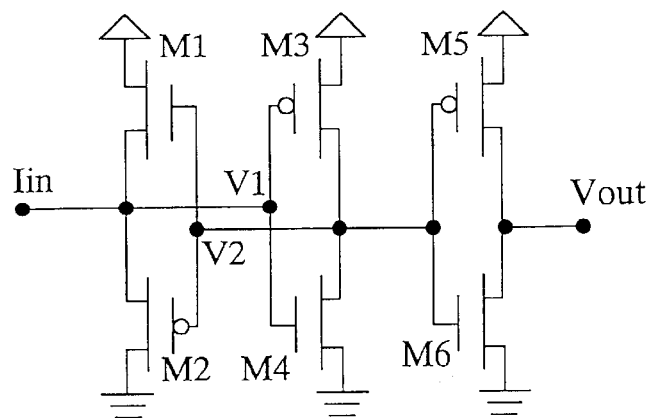
FIG. 1 shows a circuit diagram of a prior art current comparator.
Figure 2:
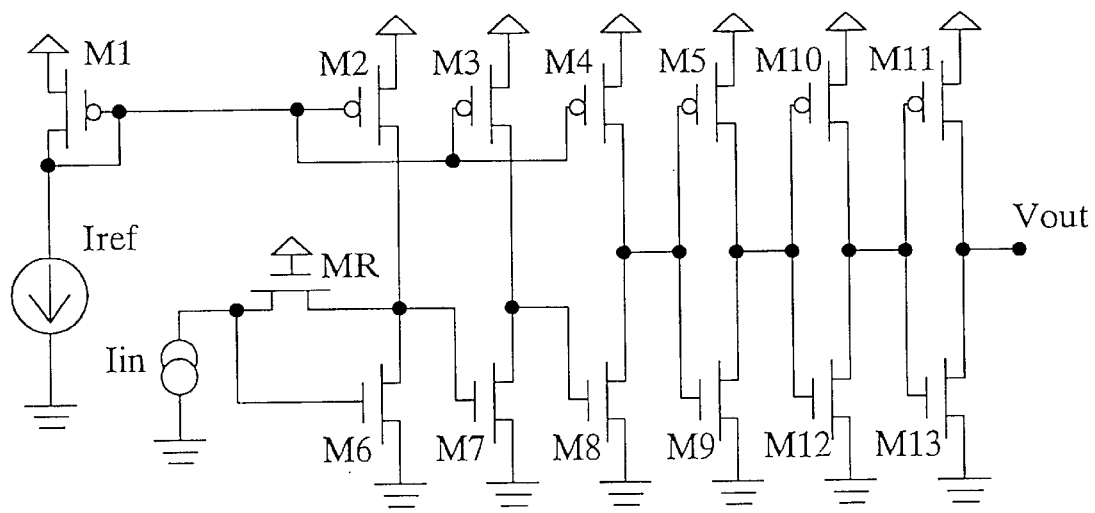
FIG. 2 shows another circuit diagram of a prior art current comparator.
Figure 5:
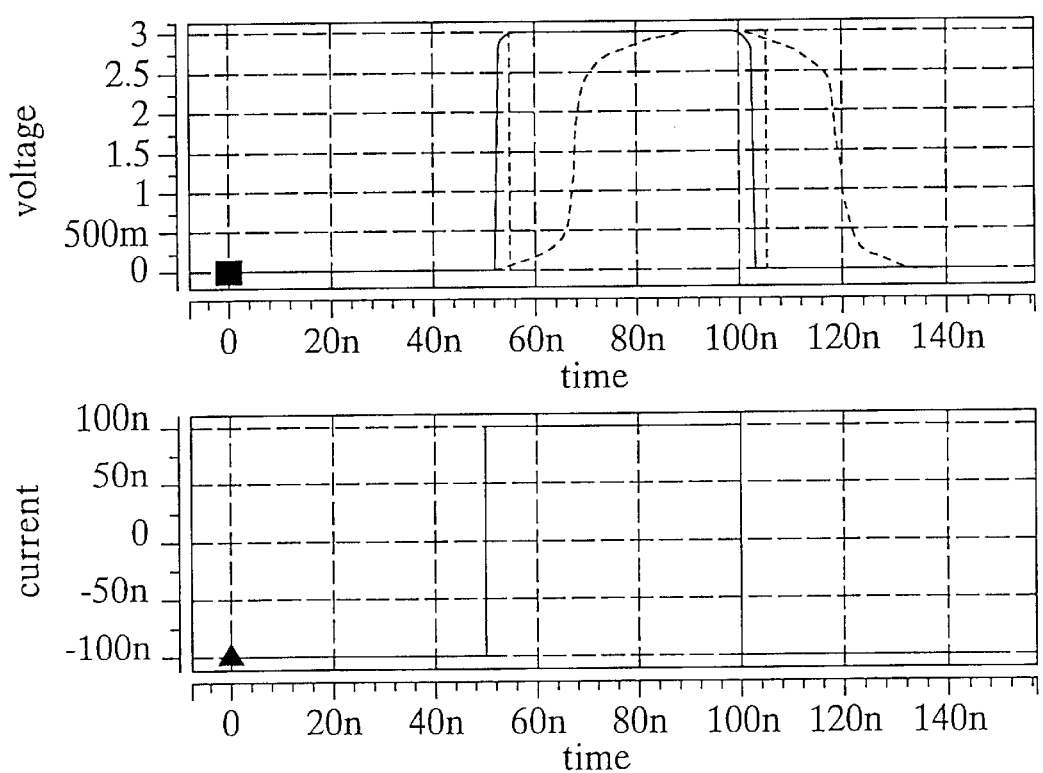
FIG. 5 shows a comparison diagram of voltage transitions of the current comparators in FIGS. 1 to 3.

FIG. 5 shows a comparison diagram of voltage transitions of the current comparators in FIGS. 1 to 3 when input current swings between –0.1 $\mu$A to 0.1 $\mu$A. The below waveform represents an input current, and the above three waveforms marked as 1, 2 and 3 represent the corresponding output waveforms of the current comparators in FIG. 1, FIG. 2 and FIG. 3. Apparently, the switching time of the present invention is faster than that of the prior art current comparators.

Figure 6:
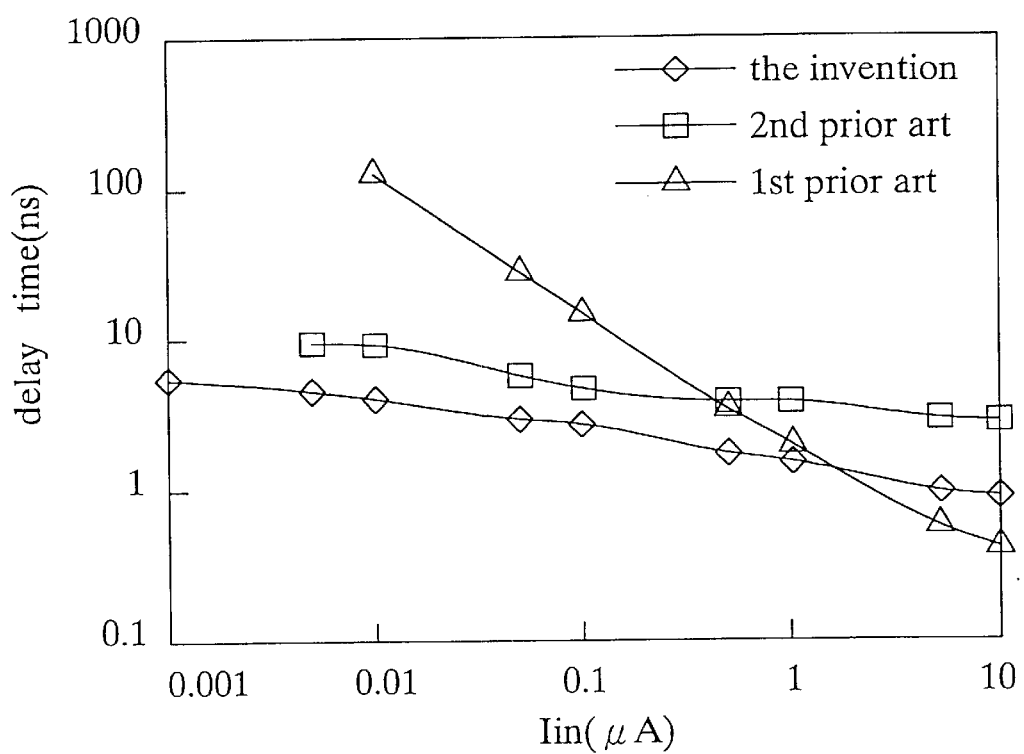
FIG. 6 shows comparison diagrams of input current vs. delay time of the current comparators in FIGS. 1 to 3.
Figure 7:
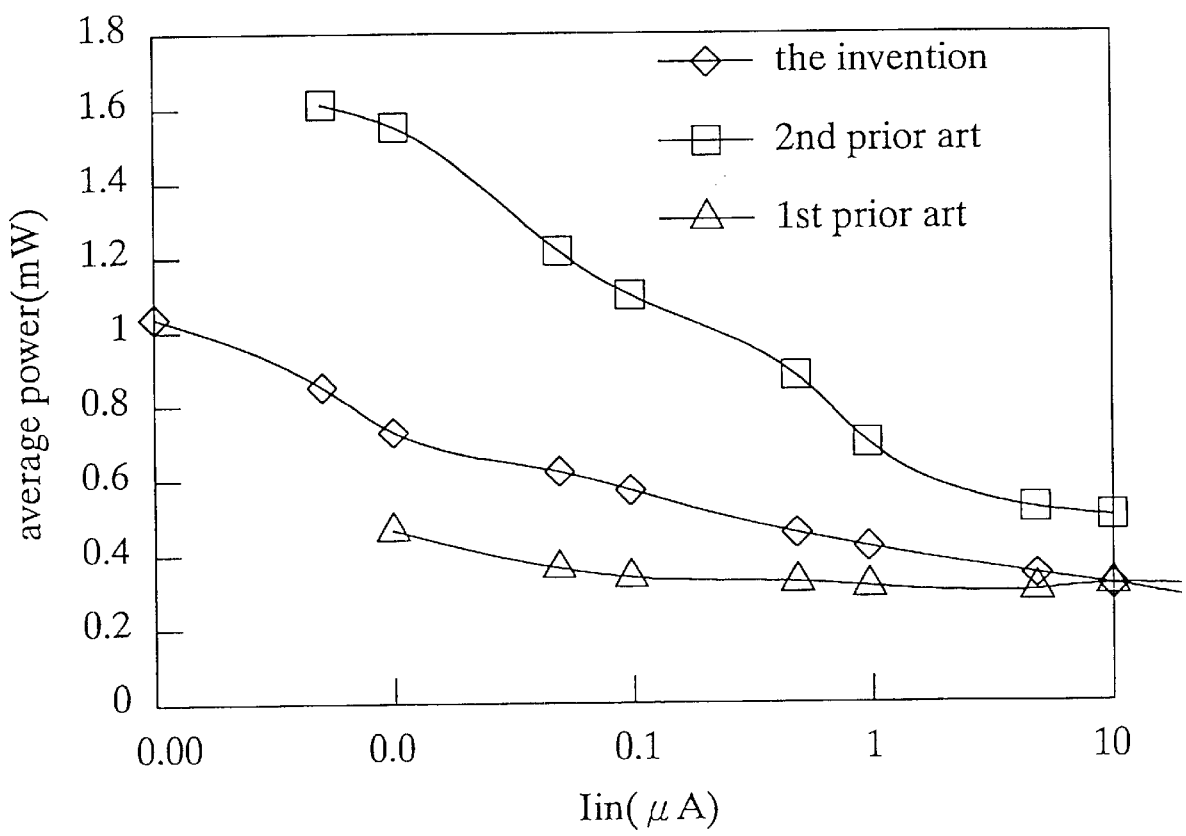
FIG. 7 shows a comparison diagram of input current vs. average power of the current comparators in FIGS. 1 to 3.

FIG. 6 shows a comparison diagram of input current vs. delay time of the current comparators in FIGS. 1 to 3, and FIG. 7 shows a comparison is diagram of input current vs. average power of the current comparators in FIGS. 1 to 3, wherein the parameter of delay time represents the total time when the time difference between input and output dividing the total variation is over 50%. Three waveforms marked as "$1^{st}$ prior art", "$2^{nd}$ prior art" and "the invention" represent the corresponding output waveforms of the current comparators in FIG. 1, FIG. 2 and FIG. 3. It is obvious that the present invention is faster than prior arts, especially when the input current is under 1 $\mu$A.

Figure 8:
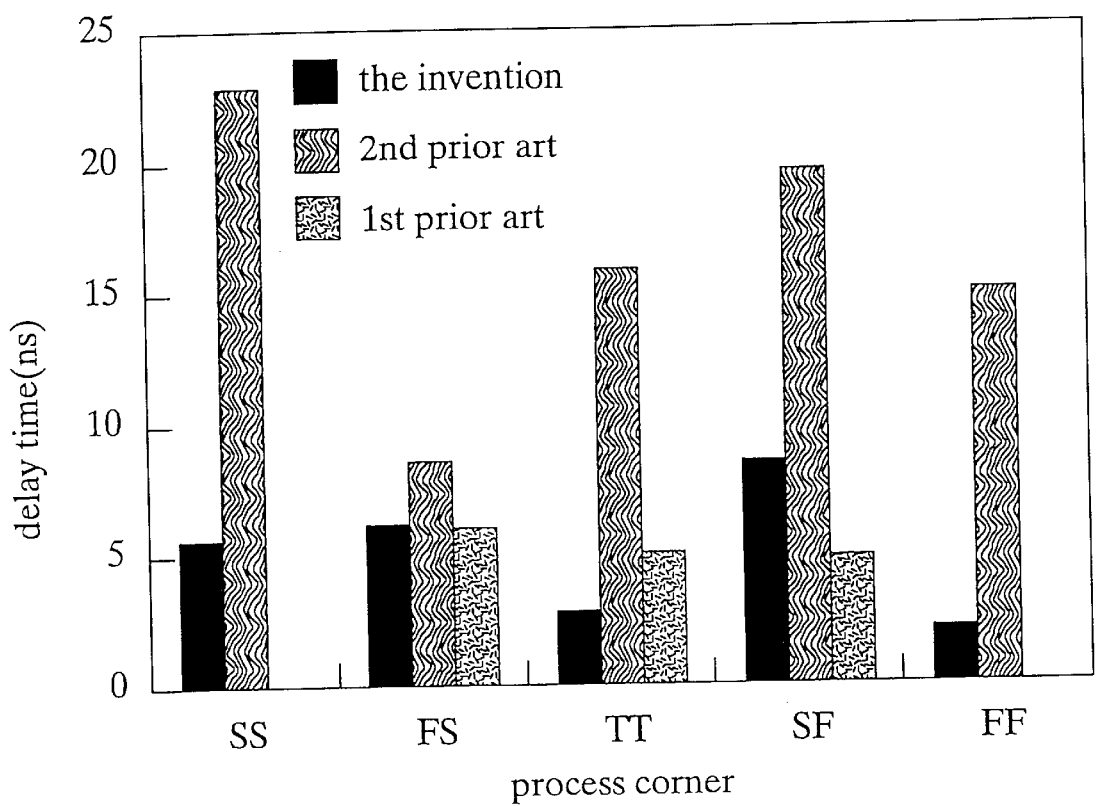
FIG. 8 shows bar diagrams of delay time in five process corners of the current comparators in FIGS. 1 to 3 when the current is under 0.1 $\mu$A.
Figure 9:
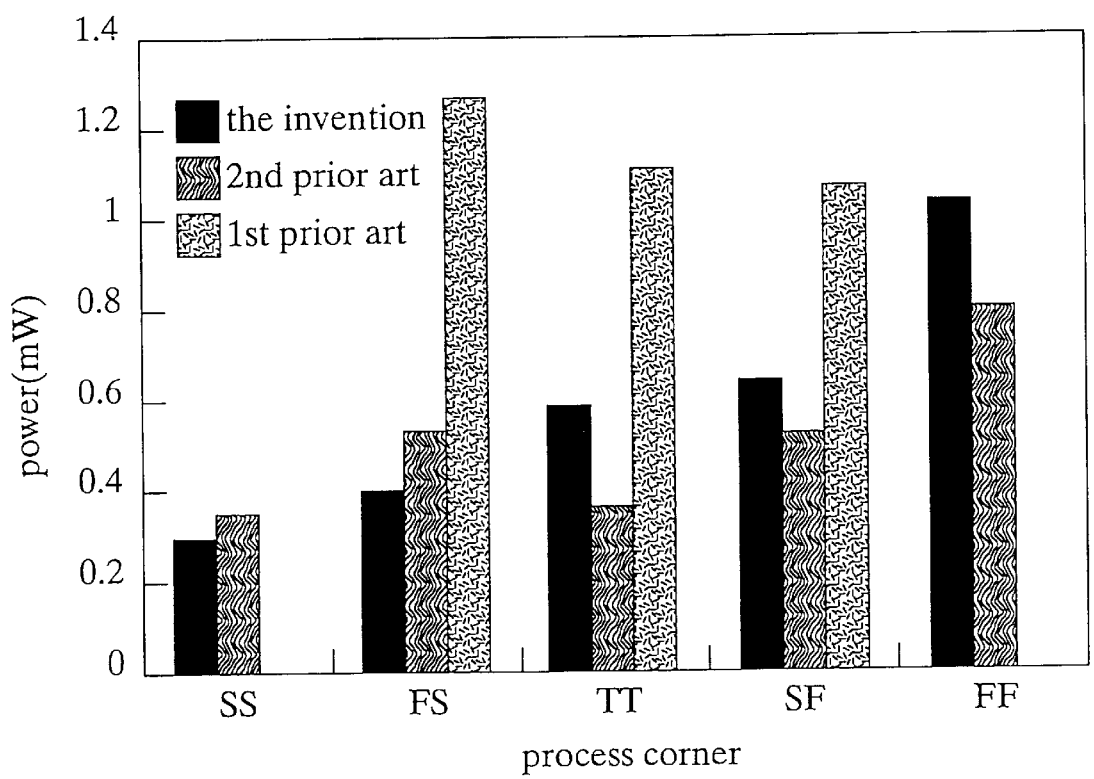
FIG. 9 shows bar diagrams of the power consumption in five process corners of the current comparators in FIGS. 1 to 3 when the current is under 0.1 $\mu$A.

As mentioned above, the present invention utilizes Vp and Vn to adjust threshold voltage when transistors are manufactured in different process corners. FIG. 8 shows a bar diagram of the delay time in five process corners of the current comparators in FIGS. 1 to 3 when input current is under 0.1 $\mu$A, and FIG. 9 shows a bar diagram of power consumptions in five process corners of the current comparators in FIGS. 1 to 3 when input current is under 0.1 $\mu$A. It is obvious that the prior art current comparator with feedback resistors is sensitive to different process corner and has large power consumption.

In conclusion, the current comparator of the present invention has a simple structure, small input impedance and fast response when the input current is low. Besides, the present invention has a small dead zone region and an adjustable switching voltage suitable for different process corners.

The above-described embodiments of the present invention are intended to be illustrated only. Numerous alternative embodiments may be devised by persons skilled in the art without departing from the scope of the following claims.

What is claimed is:

1. A current comparator, comprising:
   a first CMOS transistor including a first P-type transistor and a first N-type transistor, and source terminals of the first P-type transistor and N-type transistor being connected to an input signal of the current comparator;
   a second CMOS transistor including a second P-type transistor and a second N-type transistor, and gate terminals of the second P-type transistor and N-type transistor being connected to the input signal;
   a diode-configured N-type transistor having a gate-drain terminal and a source terminal which are respectively connected to drain terminals of the second CMOS transistor; the gate-drain terminal of the diode-configured N-type transistor further connected to the gate terminal of the first N-type transistor and the source terminal of the diode-configured N-type transistor further connected to the gate terminal of the first P-type transistor;
   a third CMOS transistor, the gate terminal of the N-type transistor of the third CMOS transistor connected to the gate-drain terminal of the diode-configured N-type transistor, and the gate terminal of the P-type transistor of the third CMOS transistor connected to the source terminal of the diode-configured N-type transistor;
   a fourth CMOS transistor whose gate terminals are connected to the output of the third CMOS transistor; and
   a fifth CMOS transistor whose gate terminals are connected to the output of the fourth CMOS transistor, and the output of the fifth CMOS transistor being the output of the current comparator.

2. The current comparator of claim 1, further comprising a N-type transistor and a P-type transistor for adjusting channel lengths, the drain terminals of the N-type and P-type transistors connected to the source terminals of the fourth CMOS transistor, and the gate terminals of the N-type and P-type transistors being applied a modulated voltage.

3. The current comparator of claim 1, wherein the output of the fifth CMOS transistor is further connected to at least two CMOS inverters.

4. A current comparator, comprising:
   a first CMOS transistor including a first P-type transistor and a first N-type transistor, and source terminals of the first P-type transistor and N-type transistor being connected to an input signal of the current comparator;
   a second CMOS transistor including a second P-type transistor and a second N-type transistor, and gate terminals of the second P-type transistor and N-type transistor being connected to the input signal;
   a diode-configured P-type transistor having a gate-drain terminal and a source terminal which are respectively connected to drain terminals of the second CMOS transistor; the gate-drain terminal of the diode-configured P-type transistor further connected to the gate terminal of the first P-type transistor and the source terminal of the diode-configured P-type transistor further connected to the gate terminal of the first N-type transistor;
   a third CMOS transistor, the gate terminal of the N-type transistor of the third CMOS transistor connected to the gate-drain terminal of the diode-configured P-type transistor, and the gate terminal of the P-type transistor of the third CMOS transistor connected to the source terminal of the diode-configured P-type transistor;
   a fourth CMOS transistor whose gate terminals are connected to the output of the third CMOS transistor; and
   a fifth CMOS transistor whose gate terminals are connected to the output of the fourth CMOS transistor, and the output of the fifth CMOS transistor being the output of the current comparator.

5. The current comparator of claim 4, further comprising a N-type transistor and a P-type transistor for adjusting channel lengths, the drain terminals of the N-type and P-type transistors connected to the source terminals of the fourth CMOS transistor, and the gate terminals of the N-type and P-type transistors being applied a modulated voltage.

6. The current comparator of claim 4, wherein the output of the fifth CMOS transistor is further connected to at least two CMOS inverters.

* * * * *